(12) United States Patent
Huang

(10) Patent No.: US 8,960,267 B2
(45) Date of Patent: Feb. 24, 2015

(54) HEAT SINK MODULE

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 93 days.

(21) Appl. No.: 13/748,594

(22) Filed: Jan. 24, 2013

(65) Prior Publication Data

US 2014/0138074 A1     May 22, 2014

(30) Foreign Application Priority Data

Nov. 16, 2012 (CN) .......................... 2012 1 0462878

(51) Int. Cl.

| | | |
|---|---|---|
| *F28F 7/00* | (2006.01) | |
| *F28F 3/02* | (2006.01) | |
| *H01L 23/427* | (2006.01) | |
| *H01L 23/367* | (2006.01) | |
| *H01L 23/467* | (2006.01) | |
| *H05K 7/20* | (2006.01) | |

(52) U.S. Cl.
CPC ................ *F28F 3/02* (2013.01); *H01L 23/427* (2013.01); *H01L 23/3672* (2013.01); *H01L 23/467* (2013.01); *H01L 2924/0002* (2013.01)
USPC ..................... 165/80.3; 165/104.21

(58) Field of Classification Search
CPC ...... F28D 15/0275; F28F 1/32; H01L 23/427; H01L 23/467; H01L 2924/0002; H01L 23/3672

USPC ............. 165/80.3, 104.21, 67, 185; 361/700, 361/704; 257/715
See application file for complete search history.

(56) References Cited

U.S. PATENT DOCUMENTS

| | | | |
|---|---|---|---|
| 2006/0104032 A1* | 5/2006 | Lee et al. ....................... | 361/700 |
| 2006/0181848 A1* | 8/2006 | Kiley et al. ..................... | 361/697 |
| 2007/0215327 A1* | 9/2007 | Lai et al. ................... | 165/104.33 |
| 2008/0047693 A1* | 2/2008 | Chen ......................... | 165/104.33 |
| 2008/0060793 A1* | 3/2008 | Huang ...................... | 165/104.33 |
| 2009/0025909 A1* | 1/2009 | Huang ...................... | 165/104.26 |
| 2009/0194255 A1* | 8/2009 | Huang .......................... | 165/80.3 |

* cited by examiner

*Primary Examiner* — Tho V Duong
(74) *Attorney, Agent, or Firm* — Pai Patent & Trademark Law Firm; Chao-Chang David Pai

(57) ABSTRACT

A heat sink module includes a base block having opposing top wall and bottom wall, insertion grooves located at the top wall, heat pipe grooves located at the bottom wall and rows of equally spaced holes cut through the top and bottom walls in communication between the insertion grooves and the heat pipe grooves and matching the insertion grooves, heat pipes mounted in the heat pipe grooves of the base block, and radiation fins respectively mounted in the insertion grooves of the base block, each radiation fin having heat pipe mating edges respectively inserted into the holes and stopped against the heat pipes for dissipating heat from the heat pipes.

9 Claims, 8 Drawing Sheets

HEAT SINK MODULE

BACKGROUND OF THE INVENTION (a) Field of the Invention

The present invention relates to heat sink technology and more particularly to a heat sink module, which enables radiation fins to be partially inserted through the base block thereof into direct contact with heat pipes at the bottom side of the base block for quick dissipation of heat.

(b) Description of the Prior Art

Conventional heat sinks generally comprise a base block, a plurality of radiation fins and one or more heat pipes. The radiation fins are arranged at the top wall of the base block. The base block provides one or more heat pipe grooves at the bottom wall thereof. Each heat pipe has its one end press-fitted into one respective heat pipe groove at the bottom wall of the base block, and its other end curved and inserted through the radiation fins. Taiwan Patent Application No. 1359254 discloses a heat sink module, entitled "Heat sink with attached heat pipe". Taiwan Utility No. M416756 discloses a heat sink design, entitled "Heat sink with paralleled heat pipes". According to these two prior art designs, which were invented by the present inventor, heat pipe grooves are provided at a bottom wall of a base block, and heat pipes are press-fitted into the heat pipe grooves and kept in flush with the bottom wall of the base block for direct contact with a heat source (for example, CPU).

Taiwan Utility No. M421693 discloses a heat sink design, entitled "Radiation fin type heat sink structure". According to this design, heat pipes are embedded between a base block and radiation fins. When the base block is attached to a heat source (for example, CPU) during application of the heat sink structure, the heat pipes are not kept in direct contact with the heat source (CPU). Thus, waste heat can simply be transferred from the heat source (CPU) to the heat pipes and the radiation fins by the base block for further dissipation.

The aforesaid technique of using heat pipe grooves to match with heat pipes is commonly used in prior art heat sink modules. According to this technique, radiation fins can simply be fastened to the top wall of the base block without direct contact with the heat source (CPU). In consequence, the heat pipes cannot transfer absorbed heat to the radiation fins directly. In this case, the radiation fins can simply dissipate heat indirectly.

Further, the depth of the heat pipe grooves at the bottom wall of the prior art base block must be properly controlled so that heat pipes can be press-fitted into the heat pipe grooves and kept in flush with the bottom wall of the base block. If the depth of the heat pipe grooves is insufficient, for example, shorter than the radius of the heat pipes, the heat pipes cannot be completely engaged into the heat pipe grooves. If the depth of the heat pipe grooves is increased, the base block must be made relatively thicker so that a proper distance (thickness) can be maintained between the heat pipe grooves and the top wall of the base block. However, increasing the thickness of the base block relatively increases the consumption of the material (aluminum, copper or their alloys) and related cost.

SUMMARY OF THE INVENTION

The present invention has been accomplished under the circumstances in view. The heat sink module of the present invention comprises a base block comprising a top wall and an opposing bottom wall, a plurality of insertion grooves located at the top wall and at least one heat pipe groove located at the bottom wall, a plurality of radiation fins respectively mounted in the insertion grooves of the base block, and at least one heat pipe mounted in the at least one heat pipe groove of the base block, wherein the base block further comprises at least one row of equally spaced holes cut through the top and bottom walls thereof in communication between the insertion grooves and the at least one heat pipe groove and matching the insertion grooves; the radiation fins each comprise at least one heat pipe mating edge respectively inserted into the holes and stopped against the at least one heat pipe for rapidly dissipating heat from the at least one heat pipe.

Further, the depth of the heat pipe grooves at the bottom wall of the base block is defined to be in proximity to the top wall of the base block, shortening the distance (thickness) between the heat pipe grooves and the top wall, and therefore the thickness of the base block can be minimized to reduce the total weight and material cost of the base block.

Further, each radiation fin comprises a folded fin portion terminating in the at least one heat pipe mating edge. The design of the folded fin portion enables each radiation fin to be conveniently press-fitted into one insertion groove of the base block to force the at least one heat pipe mating edge into corresponding holes into direct contact with each heat pipe.

Further, each heat pipe mating edge of each radiation fin can be a flat edge, arched edge, or trapezoidal edge capable of making direct contact with one respective heat pipe.

DETAILED DESCRIPTION OF THE PREFERRED EMBODIMENTS

Figure 1:
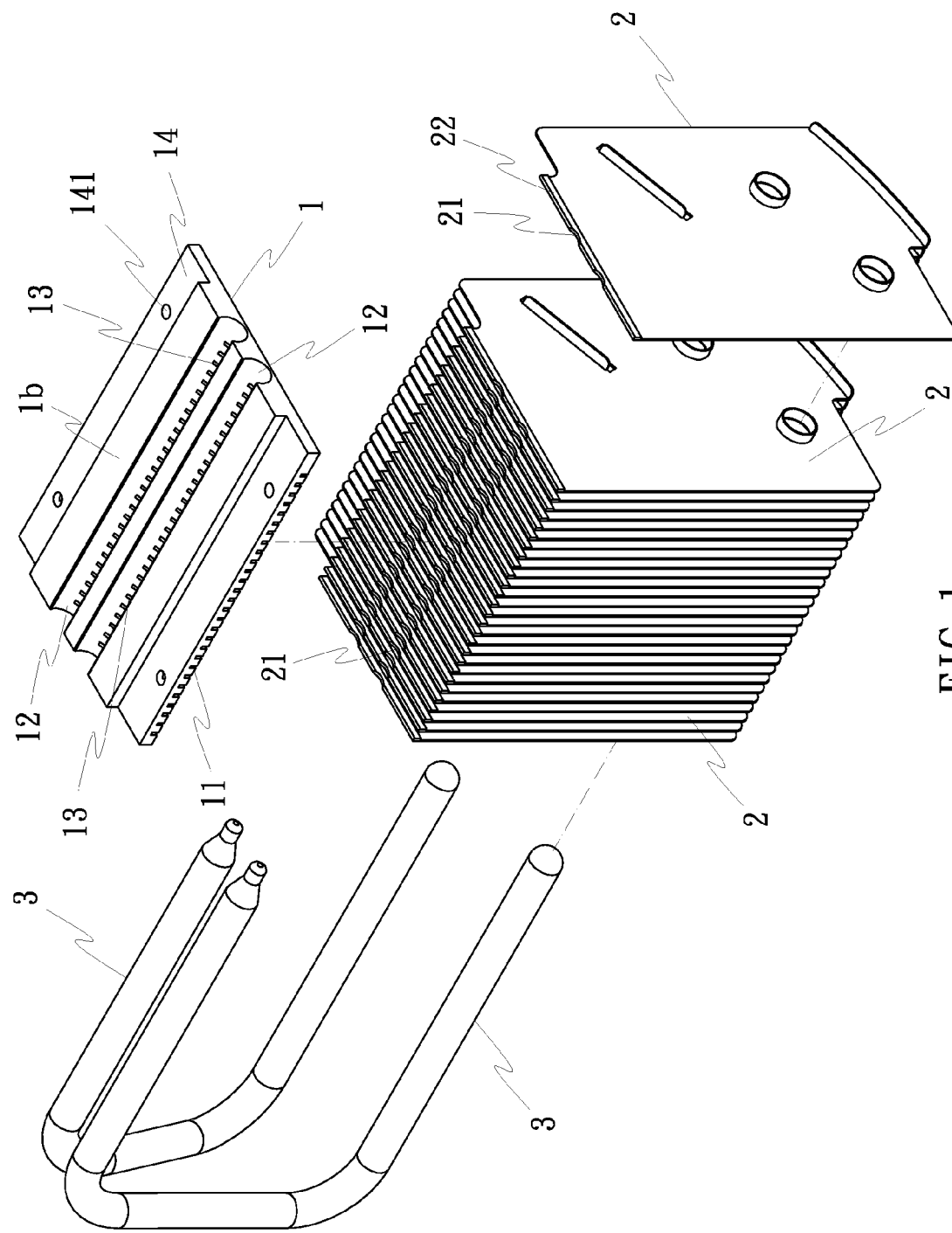
FIG. 1 is an exploded view of a heat sink module in accordance with the present invention.
Figure 2:
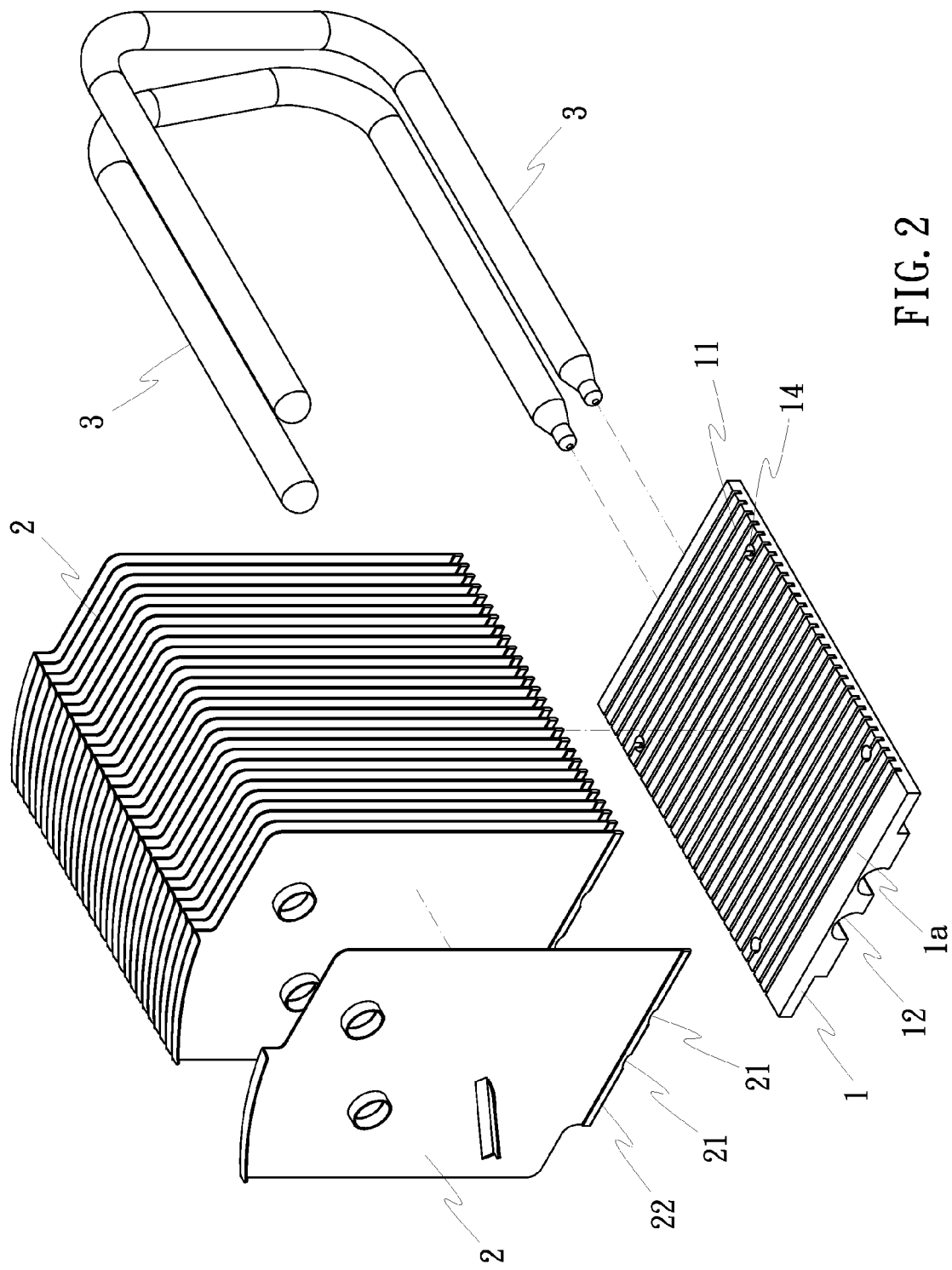
FIG. 2 corresponds to FIG. 1 when viewed from another angle.
Figure 3:
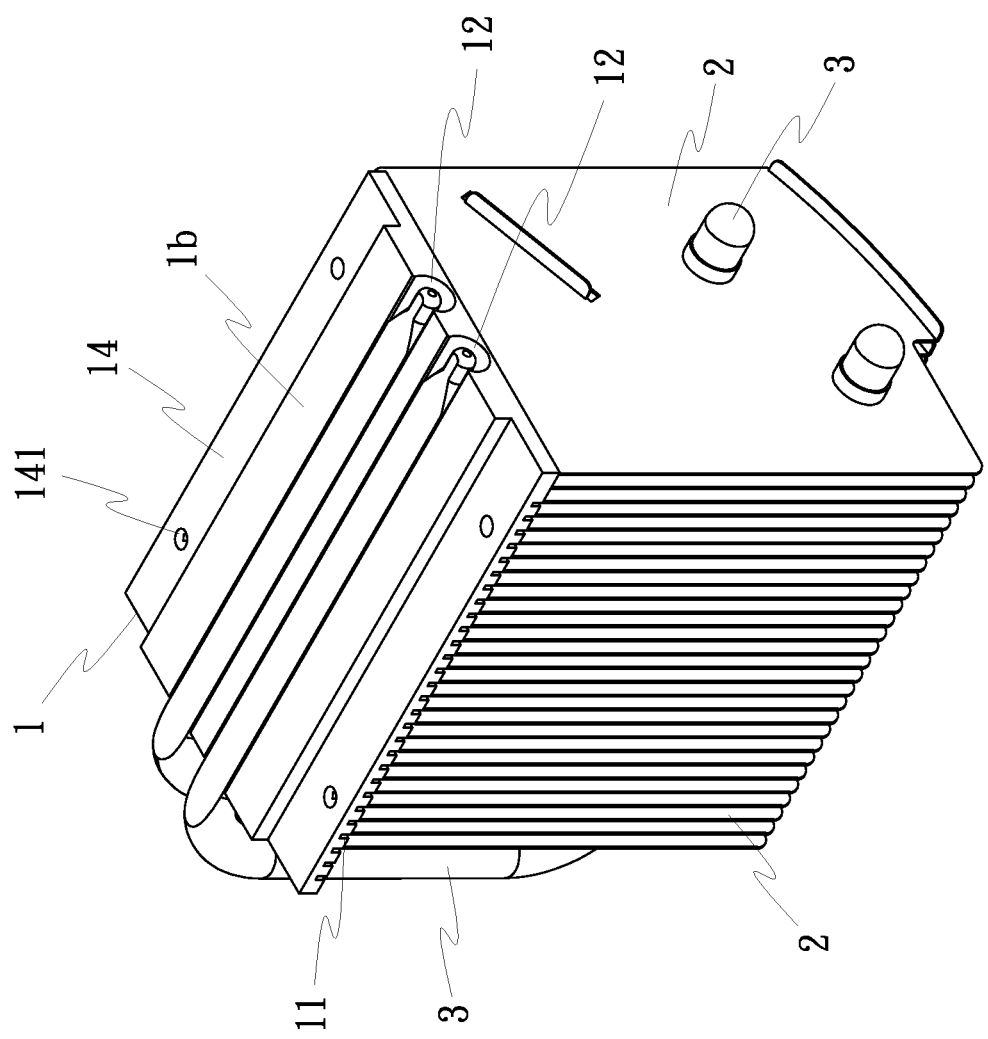
FIG. 3 is an assembly view of the heat sink module in accordance with the present invention.

Referring to FIGS. 1-3, a heat sink module in accordance with the present invention comprises a base block 1, a plurality of radiation fins 2 and a plurality of heat pipes 3.

The base block 1 comprises opposing top wall 1a and bottom wall 1b, a plurality of insertion grooves 11 arranged in parallel at the top wall 1a, a plurality of heat pipe grooves 12 located at the bottom wall 1b, and rows of equally spaced holes 13 cut through the top wall 1a and the bottom wall 1b in communication between the insertion grooves 11 at the top wall 1a and the heat pipe grooves 12 at the bottom wall 1b to match the insertion grooves 11.

The radiation fins 2 are respectively press-fitted into the insertion grooves 11 at the top wall 1a of the base block 1, each having a plurality of heat pipe mating edges 21 corresponding to one respective hole 13 in each heat pipe groove 12.

Figure 4:
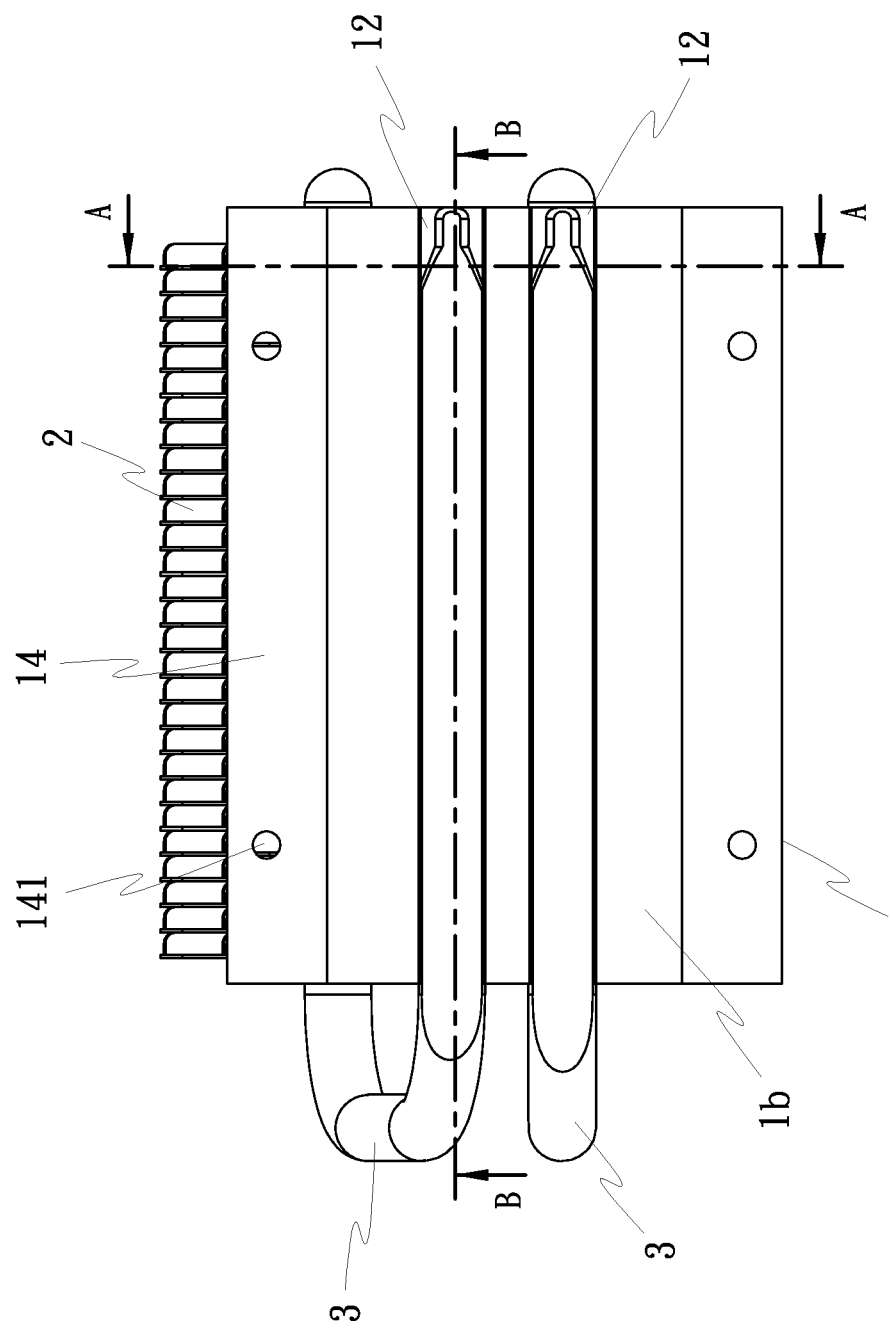
FIG. 4 is a top view of FIG. 3.

The heat pipes 3 are press-fitted into the heat pipe grooves 12 at the bottom wall 1b of the base block 1 and kept in flush with the bottom wall 1b of the base block 1 (see FIG. 3 and FIG. 4). The heat pipes 3 can be curved and tightly inserted through the radiation fins 2. However, there are no shape limitations on the radiation fins 2.

According to the aforesaid structural design, the radiation fins 2 are press-fitted into the insertion grooves 11 at the top wall 1a of the base block 1 to force the heat pipe mating edges 21 thereof into the holes 13 of the base block 1 against the heat pipes 3. Thus, the radiation fins 2 can directly transfer waste heat from the heat pipes 3, enhancing heat dissipation efficiency.

Figure 6:
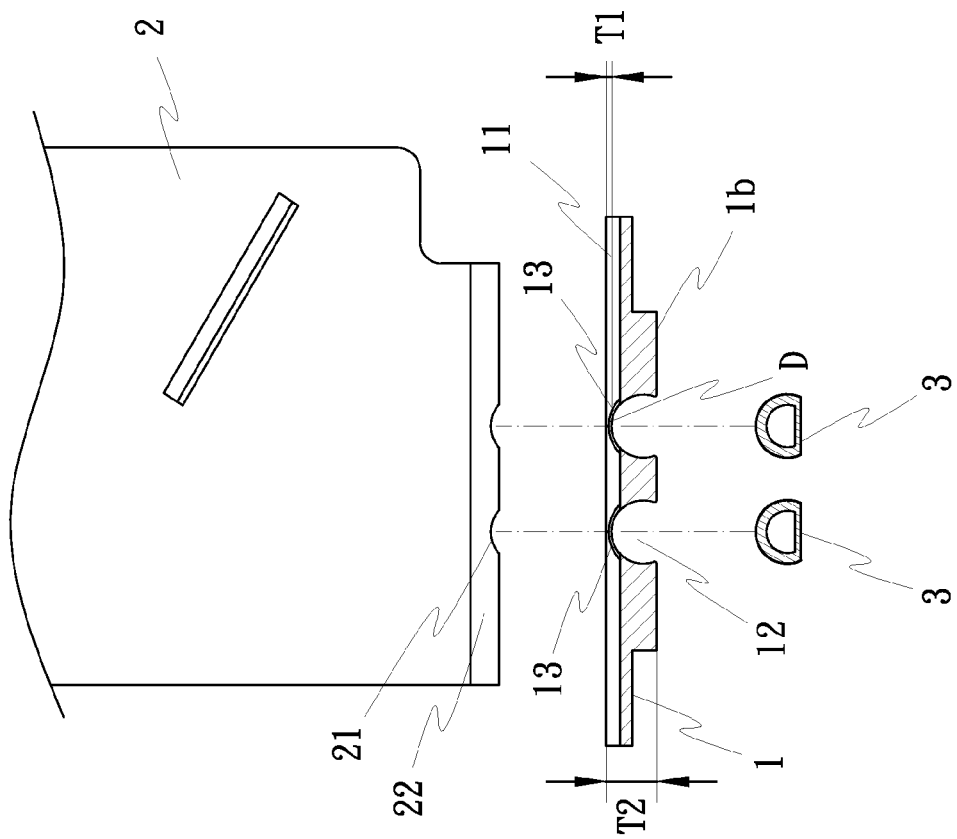
FIG. 6 is an exploded view of FIG. 5.
Figure 5:
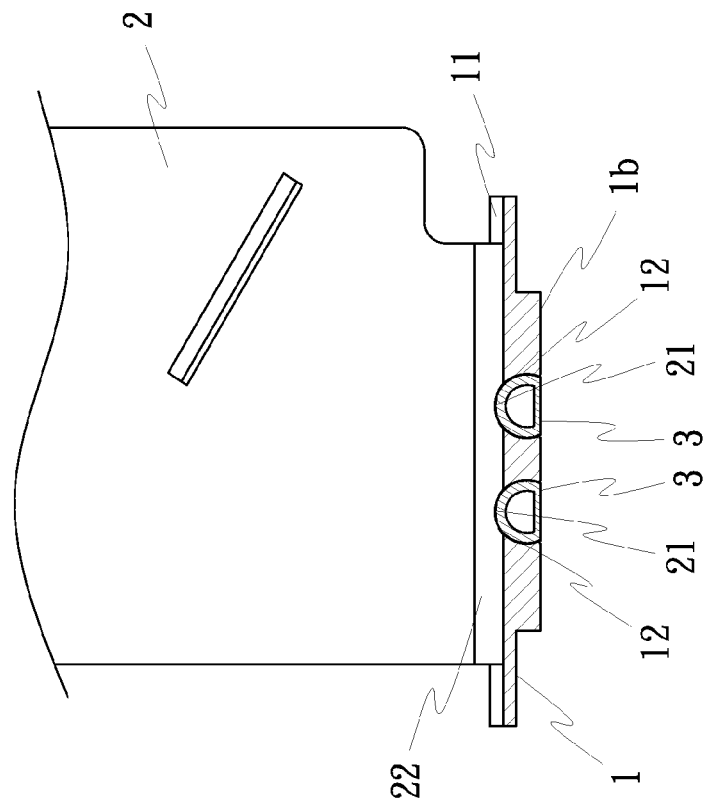
FIG. 5 is a sectional view taken along line A-A of FIG. 4.

As shown in FIG. 5 and FIG. 6, the design spirit of the present invention is that the depth D of the heat pipe grooves 12 at the bottom wall 1b of the base block 1 is defined to be in proximity to the top wall 1a of the base block 1, shortening the distance T1 (thickness) between the heat pipe grooves 12 and the top wall 1a, and therefore the thickness T2 of the base block 1 can be minimized to reduce the total weight and material cost of the base block 1.

As illustrated, the lower part of each radiation fin 2 is bent to form a folded fin portion 22 carrying the heat pipe mating edges 21 that are engaged into the respective holes 13 and kept in direct contact with the respective heat pipes 3.

Figure 8:
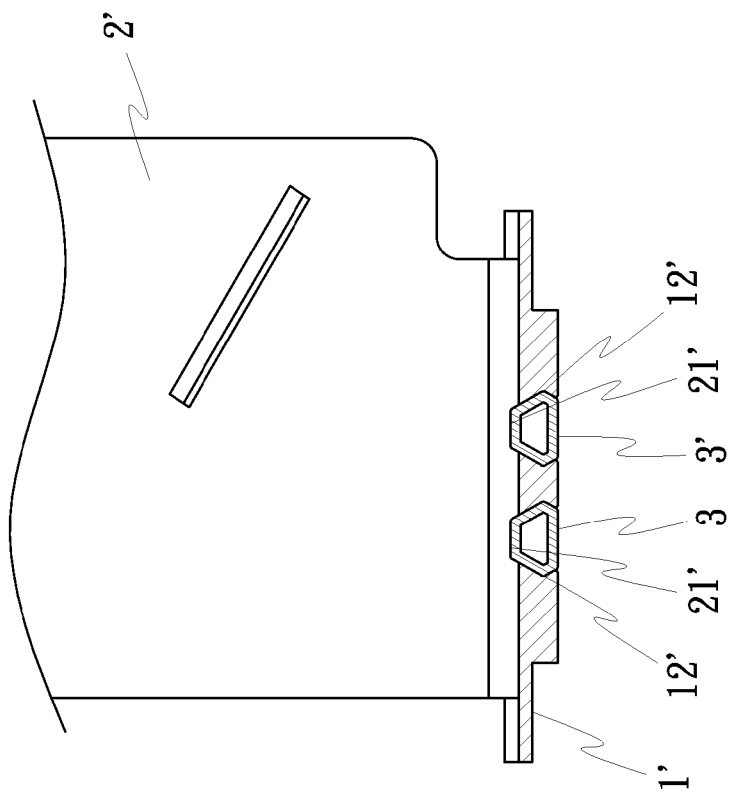
FIG. 8 is a sectional assembly view of FIG. 7.
Figure 7:
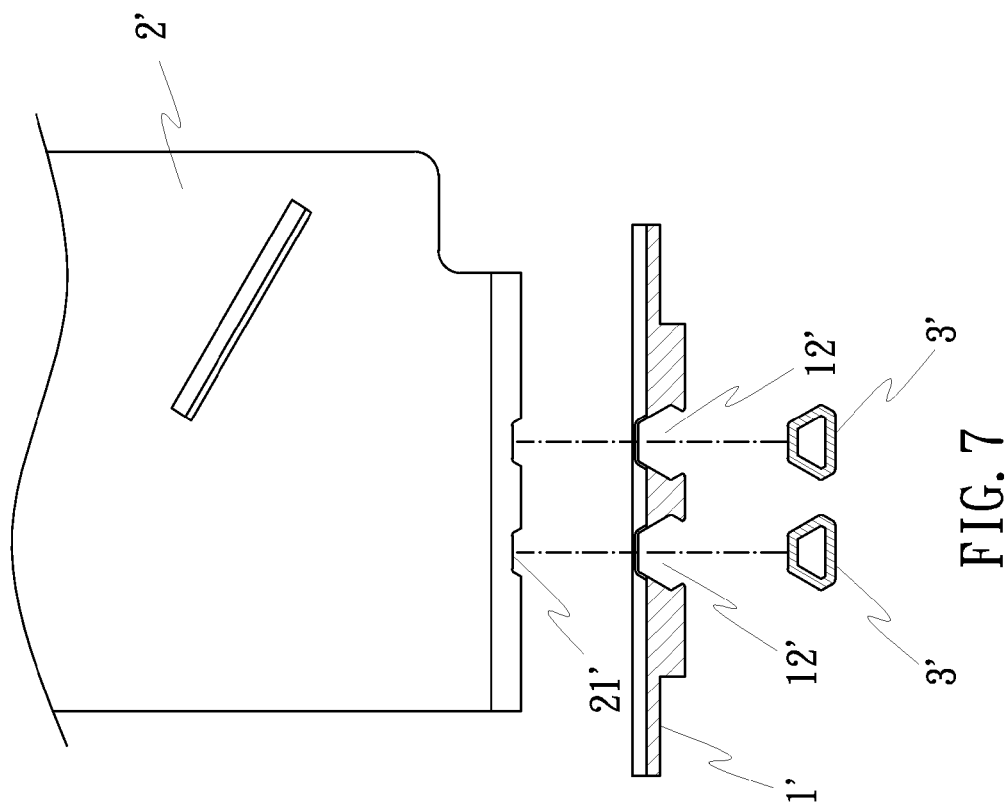
FIG. 7 is a sectional exploded view of a part of an alternate form of the heat sink module in accordance with the present invention.

The heat pipe mating edges 21 of the radiation fins 2 can be flat edges, arched edges, or trapezoidal edges capable of making direct contact with the heat pipes 3. In the embodiment shown in FIGS. 5 and 6, the heat pipes 3 have a substantially semicircular cross section; the heat pipe mating edges 21 of the radiation fins 2 are smoothly arched to fit the arched outer perimeters of the heat pipes 3; in the embodiment shown in FIGS. 7 and 8, the heat pipes 3' have a trapezoidal cross section; the heat pipe mating edges 21' of the radiation fins 2' are configured to fit the trapezoidal outer perimeters of the heat pipes 3'.

As stated above, the heat pipe grooves 12 of the base block 1 can be variously shaped to match with the cross section of the heat pipes 3. Further, the heat pipes 3 can be press-fitted into the heat pipe grooves 12 of the base block 1 and then flattened into flush with the bottom wall 1b of the base block 1. Thus, the shape of the heat pipes 3 are changed according to the shape of the heat pipe grooves 12, enhancing connection tightness between the base block 1 and the heat pipes 3.

Figure 9:
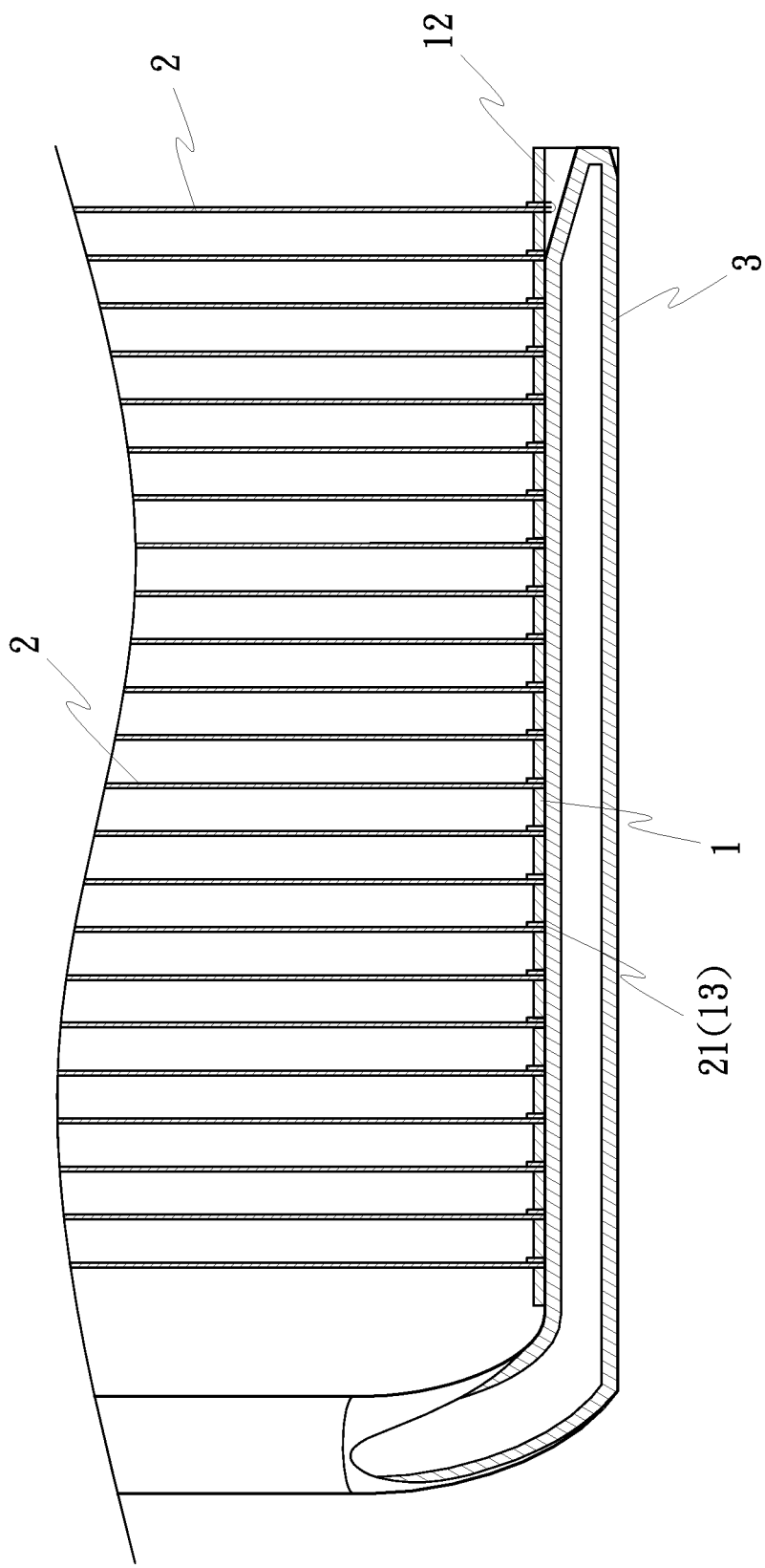
FIG. 9 is a sectional view taken along line B-B of FIG. 4.

FIG. 9 is a sectional view taken along line B-B of FIG. 4. As illustrated, the heat pipe mating edges 21 of the radiation fins 2 are engaged into the holes 13 of the base block 1 and kept in direct contact with the heat pipes 3 for quick transfer of heat from the heat pipes 3.

Figure 10:
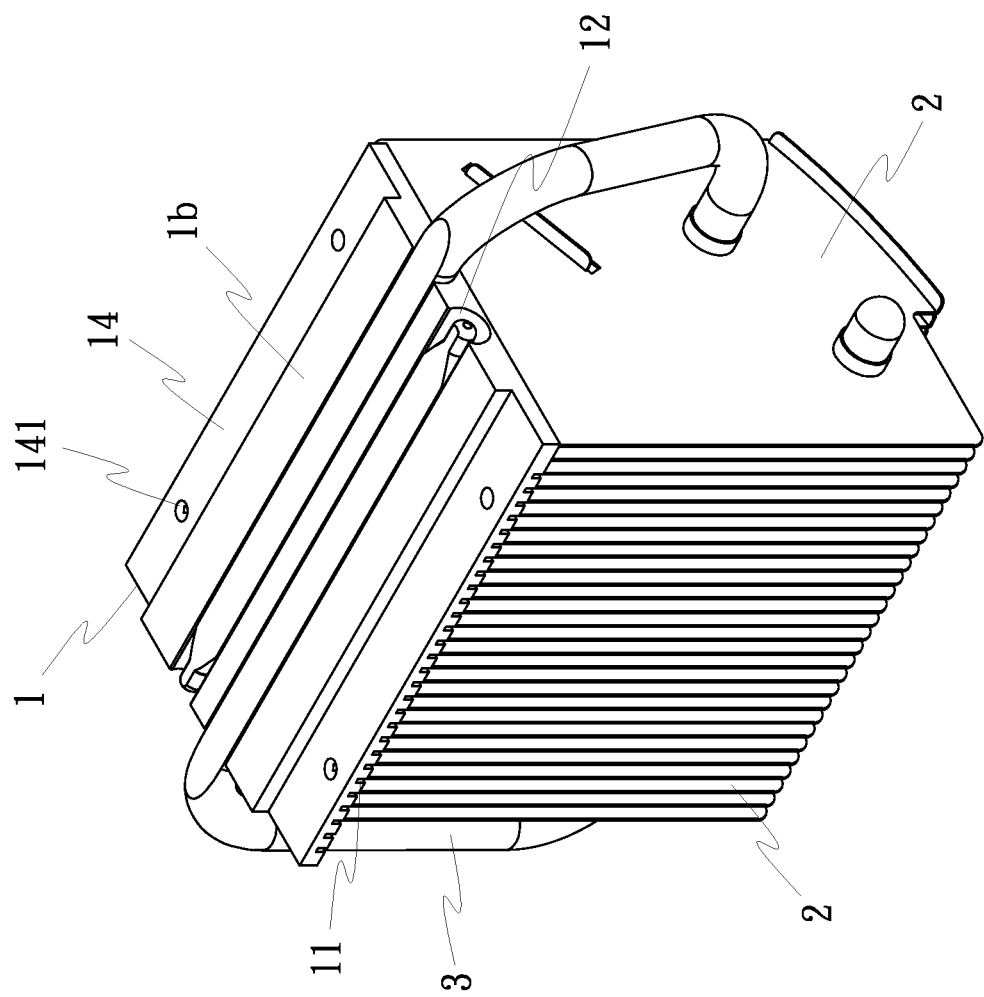
FIG. 10 is an elevational assembly view of another alternate form of the heat sink module in accordance with the present invention.

As illustrated in the annexed drawings, the heat pipes 3 are curved, each having one end thereof press-fitted into one respective heat pipe groove 12 at the bottom wall 1b of the base block 1 and the other end thereof tightly inserted through the radiation fins 2. The heat pipes 3 can be arranged one same side and inserted through the radiation fins 2 in one same direction, as shown in FIG. 3. Alternatively, the heat pipes 3 can be arranged at two opposite sides and inserted through the radiation fins 2 in reversed directions, as shown in FIG. 10.

Further, the base block 1 comprises two mounting flanges 14 disposed at two opposite lateral sides below the elevation of the bottom wall 1b, and a plurality of mounting holes 141 located at the mounting flanges 14. By means of the mounting holes 141, the base block 1 can be affixed to an external object by screws or other fastening members.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A heat sink module, comprising: a base block comprising a top wall and an opposing bottom wall, a plurality of insertion grooves located at said top wall, at least one heat pipe groove located at said bottom wall; a plurality of radiation fins respectively mounted in said insertion grooves of said base block; and at least one heat pipe mounted in said at least one heat pipe groove of said base block, wherein:

said base block comprises at least one row of equally spaced holes cut through said top wall and said bottom wall and kept in communication between said insertion grooves and said at least one heat pipe groove and matching said insertion grooves;

said radiation fins each comprise at least one heat pipe mating edge respectively inserted into said holes and stopped against said at least one heat pipe for dissipating heat from said at least one heat pipe.

2. The heat sink module as claimed in claim 1, wherein said insertion grooves of said base block are arranged in parallel.

3. The heat sink module as claimed in claim 1, wherein the part of each said heat pipe press-fitted into one said heat pipe groove is kept in flush with the bottom wall of said base block.

4. The heat sink module as claimed in claim 1, wherein each said radiation fin comprises a folded fin portion terminating in said at least one heat pipe mating edge.

5. The heat sink module as claimed in claim 1, wherein each said heat pipe mating edge of each said radiation fin is a flat edge.

6. The heat sink module as claimed in claim 1, wherein each said heat pipe mating edge of each said radiation fin is an arched edge.

7. The heat sink module as claimed in claim 1, which comprises a plurality of heat pipes arranged at said base block at one same side and inserted through said radiation fins in one same direction.

8. The heat sink module as claimed in claim 1, which comprises a plurality of heat pipes arranged at said base block at two opposite sides and inserted through said radiation fins in reversed directions.

9. The heat sink module as claimed in claim 1, wherein said base block comprises two mounting flanges disposed at two opposite lateral sides below the elevation of said bottom wall, and a plurality of mounting holes located at said mounting flanges.

* * * * *